(12) United States Patent
Sano

(10) Patent No.: US 9,557,528 B2
(45) Date of Patent: Jan. 31, 2017

(54) IMAGE PICKUP LENS AND IMAGE PICKUP DEVICE

(75) Inventor: Eigo Sano, Hino (JP)

(73) Assignee: Konica Minolta, Inc., Tokyo (JP)

( * ) Notice: Subject to any disclaimer, the term of this patent is extended or adjusted under 35 U.S.C. 154(b) by 358 days.

(21) Appl. No.: 14/239,724

(22) PCT Filed: Aug. 15, 2012

(86) PCT No.: PCT/JP2012/070773
§ 371 (c)(1),
(2), (4) Date: Feb. 19, 2014

(87) PCT Pub. No.: WO2013/027641
PCT Pub. Date: Feb. 28, 2013

(65) Prior Publication Data
US 2014/0209786 A1    Jul. 31, 2014

(30) Foreign Application Priority Data

Aug. 19, 2011 (JP) .................................. 2011-179992

(51) Int. Cl.
*G02B 13/00* (2006.01)
*H01L 27/146* (2006.01)

(52) U.S. Cl.
CPC ..... *G02B 13/0045* (2013.01); *H01L 27/14625* (2013.01)

(58) Field of Classification Search
CPC G02B 13/0045; G02B 13/00; H01L 27/14625
(Continued)

(56) References Cited

U.S. PATENT DOCUMENTS

| 7,027,231 B2* | 4/2006 | Miyano | G02B 23/243 359/661 |
|---|---|---|---|
| 2004/0156304 A1* | 8/2004 | Sakamoto | G11B 7/1374 369/112.23 |

(Continued)

FOREIGN PATENT DOCUMENTS

| JP | 62-125312 | 6/1987 |
|---|---|---|
| JP | 6-222260 | 8/1994 |

(Continued)

OTHER PUBLICATIONS

Office Action dated Aug. 4, 2015 which issued in the corresponding Japanese Patent Application No. 2013-529981.

*Primary Examiner* — Georgia Y Epps
*Assistant Examiner* — Don Williams
(74) *Attorney, Agent, or Firm* — Cozen O'Connor

(57) ABSTRACT

The present invention provides a compact and high-performance image pickup lens having a fast F-number and capable of suppressing shading by using a curved projection surface. An image pickup lens 10 includes a first lens L1 having a positive refractive power, a second lens L2 having a negative refractive power, a third lens L3 having a positive or negative refractive power, a fourth lens L4 having a positive or negative refractive power, and a fifth lens L5 having a negative refractive power. With regard to the fifth lens L5 among these lenses, at least one surface is aspherical. The above-described image pickup lens 10 satisfies a conditional expression (1): $-2.50 < f5/f < -0.10$ ... (1) where f5 is a focal length of the fifth lens L5 and f is a focal length of the entire system of the image pickup lens 10.

14 Claims, 9 Drawing Sheets

(58) Field of Classification Search
USPC .......... 250/208.1, 204, 201.8; 359/714, 763, 359/764; 348/207.99, 335
See application file for complete search history.

(56) References Cited

U.S. PATENT DOCUMENTS

| | | | | |
|---|---|---|---|---|
| 2004/0169933 A1* | 9/2004 | Toyama | ................ | G02B 15/17 359/686 |
| 2010/0165483 A1* | 7/2010 | Tang | ................... | G02B 15/173 359/715 |
| 2012/0287515 A1* | 11/2012 | Hsu | ................... | G02B 13/0045 359/717 |
| 2012/0293704 A1* | 11/2012 | Sano | ...................... | G02B 13/18 348/340 |
| 2013/0021680 A1* | 1/2013 | Chen | ................. | G02B 13/0045 359/714 |

FOREIGN PATENT DOCUMENTS

| | | |
|---|---|---|
| JP | 08-068935 | 3/1996 |
| JP | 2000-292688 | 10/2000 |
| JP | 2004-312239 | 11/2004 |
| JP | 2004-356175 | 12/2004 |
| JP | 2006-184783 | 7/2006 |
| JP | 2010-79296 | 4/2010 |
| JP | 2010-197665 | 9/2010 |
| JP | 2010-224521 | 10/2010 |
| JP | 2011-095513 | 5/2011 |
| WO | WO 2010/024198 | 3/2010 |
| WO | WO 2011/052444 | 5/2011 |

\* cited by examiner

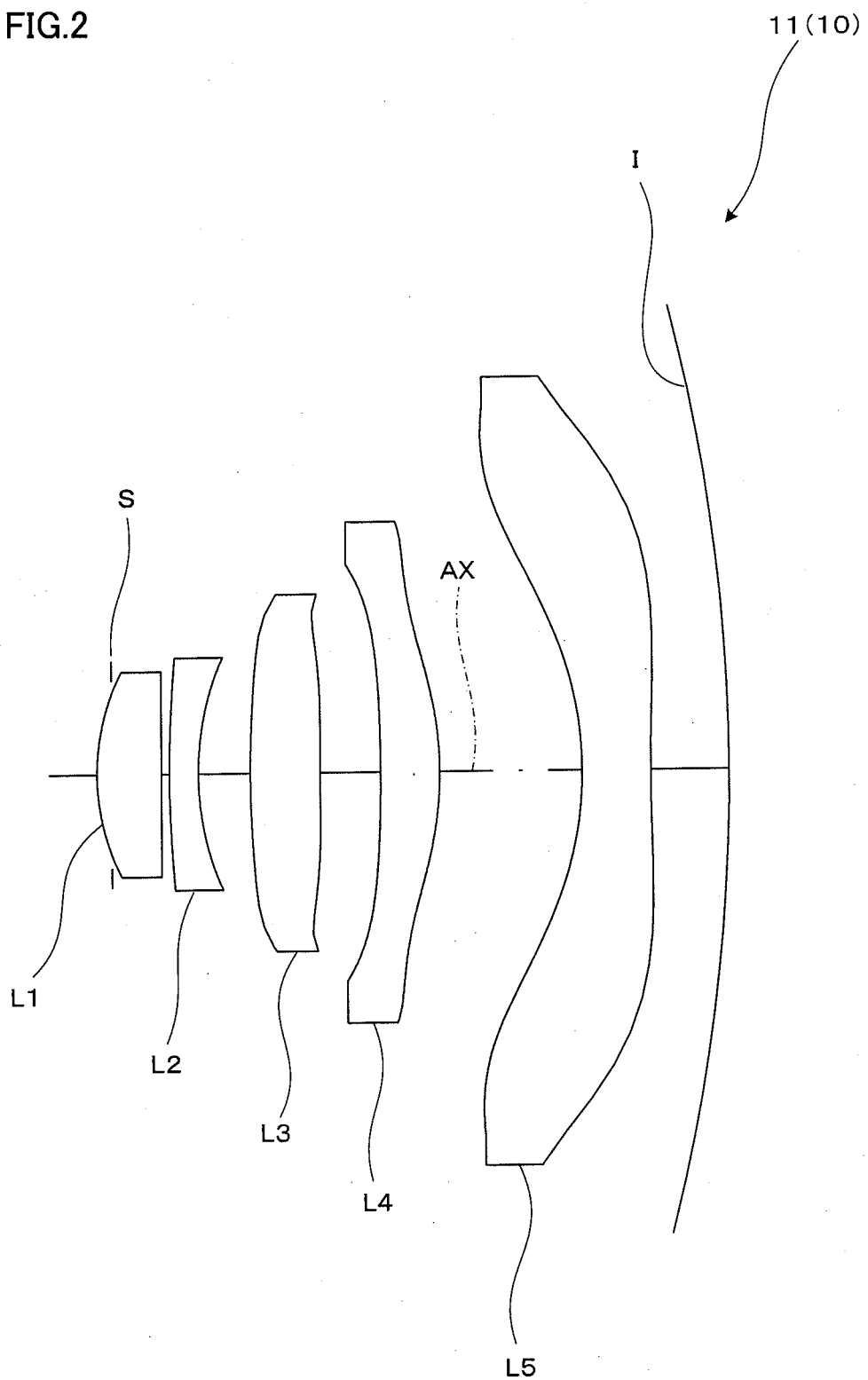

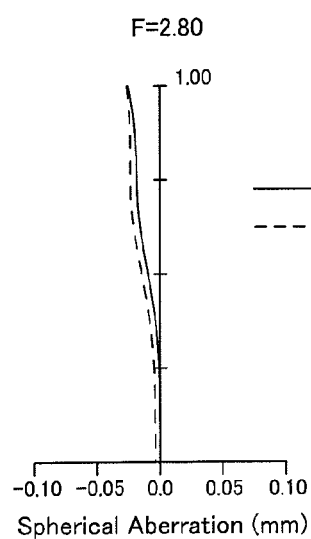
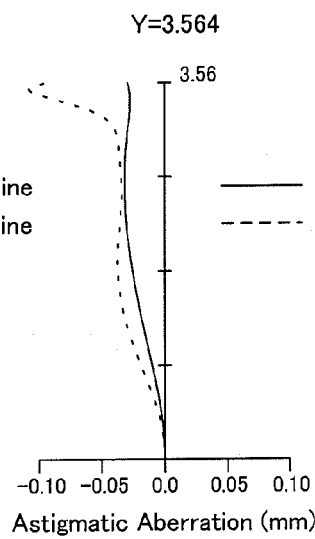
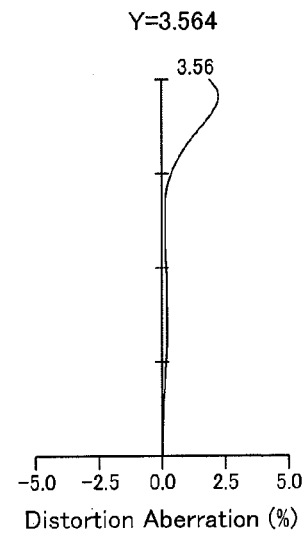
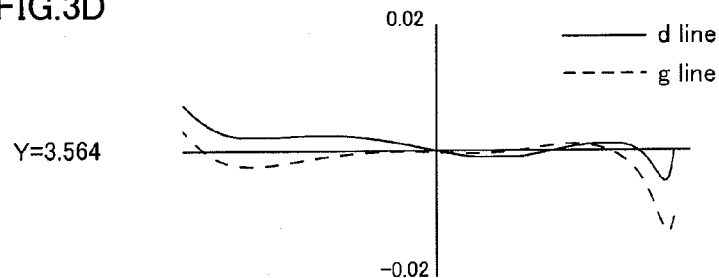
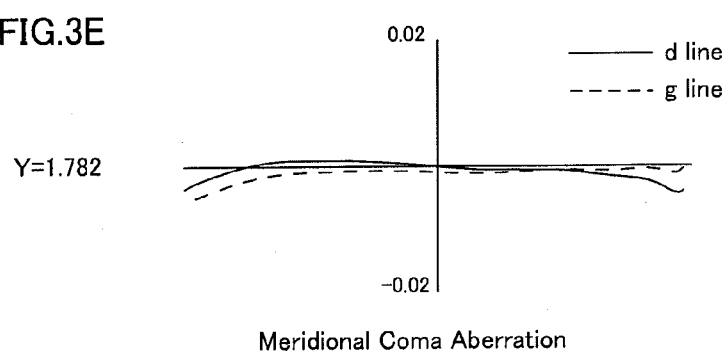

Spherical Aberration (mm)

Astigmatic Aberration (mm)

Distortion Aberration (%)

Meridional Coma Aberration

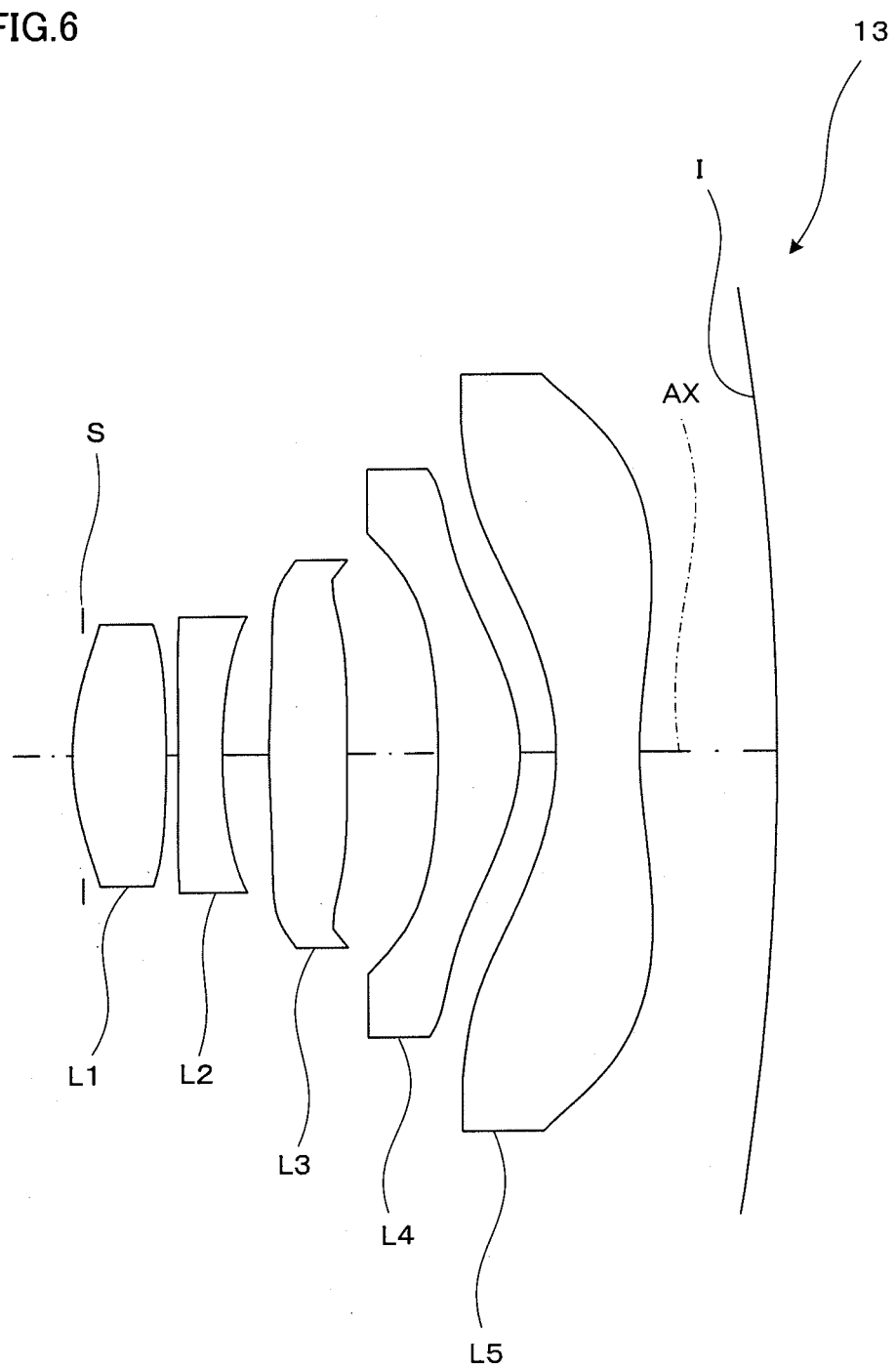

Meridional Coma Aberration

F=1.80

—— d line
---- g line

-0.10 -0.05 0.0 0.05 0.10
Spherical Aberration (mm)

Y=4.000

—— S
---- M

-0.10 -0.05 0.0 0.05 0.10
Astigmatic Aberration (mm)

Y=4.000

-2.0 -1.0 0.0 1.0 2.0
Distortion Aberration (%)

Y=4.000

—— d line
---- g line

Y=2.000

—— d line
---- g line

Meridional Coma Aberration

IMAGE PICKUP LENS AND IMAGE PICKUP DEVICE

RELATED APPLICATIONS

This is a U.S. National Phase Application under 35 USC 371 of International Application PCT/JP2012/070773 filed on Aug. 15, 2012.

This application claims the priority of Japanese application no. 2011-179992 filed Aug. 19, 2011, the entire content of which is hereby incorporated by reference.

TECHNICAL FIELD

The present invention relates to a compact image pickup lens for forming an object image to be detected by a solid-state image sensor, and to an image pickup device including such an image pickup lens.

BACKGROUND ART

In recent years, a compact image pickup device using a solid-state image sensor, such as a CCD (Charge Coupled Device) type image sensor or a CMOS (Complementary Metal Oxide Semiconductor) type image sensor, has been mounted on a mobile terminal, such as a portable telephone or a PDA (Personal Digital Assistant), and furthermore also on a notebook computer and the like, allowing not only audio information but image information to be transmitted to and from a remote place.

In the solid-state image sensor used for such an image pickup device, in recent years, the miniaturization of a pixel size progresses, and the increase in the pixel density and the miniaturization of the image sensor have been achieved. Furthermore, it also becomes possible to curve an image pickup surface and thus there is a need for a compact and high-performance image pickup lens optimum for such an image sensor.

Patent Literature 1 discloses an image pickup device with a curved solid-state image sensor. In Patent Literature 1, by curving the solid-state image sensor into a polynomial surface shape, the field curvature and distortion aberration that are caused by lenses are corrected in a balanced manner and a compact and high-resolution image pickup device is provided. However, because the solid-state image sensor has a CIF (Common Intermediate Format) size (352 pixels×288 pixels) and the image pickup lens has only one lens, chromatic aberration is not fully corrected. Therefore, a high-performance image pickup device cannot be expected to be obtained using a higher pixel density solid-state image sensor.

Patent Literature 2 and Patent Literature 3 disclose image pickup lenses having a curved image pickup surface, a photographing angle of approximately 77°, and the speed or brightness of F 5.7 to F 6.2 for the applications of a compact camera and a film unit with a lens. Here, the image pickup lens is a post-positioned aperture triplet type lens comprising a positive first lens, a negative second lens, a positive third lens, and an aperture stop.

However, in the case of the image pickup lenses of Patent Literature 2 and the like, a sufficient performance cannot be obtained with an F-number slower or darker than F 5, and the back focus of the triplet type lens as described above tends to be long, and therefore the sizes of the image pickup lens and the image pickup device will increase.

Moreover, Patent Literatures 2 and 3 relate to image pickup lenses for film cameras and attempt to improve performances by curving a film surface (image pickup surface) in accordance with the field curvature that is caused by the lens. However, each of the image pickup lenses is an image pickup lens for cameras using a roll film and therefore because of the structure of the camera, the film surface results in the so-called cylindrical image pickup surface where the film surface curves only in a long side direction of a picture plane. For this reason, while a favorable performance can be obtained in the long side direction of the picture plane, the image pickup surface in the short side direction of the picture plane remains planar, and therefore not only an improvement in the performance cannot be achieved but also degradation may be caused in accordance with the correction state of the field curvature. With the curving only in the long side direction of an image pickup surface as with Patent Literatures 2 and 3, it is difficult to obtain high performance across the entire picture plane. Therefore, usually the focal depth is set deep by setting the F-number of the lens slow so that a blur in the plane direction is prevented from becoming conspicuous, and therefore it has been difficult to set the F-number faster or brighter.

Furthermore, because the image pickup lenses of Patent Literatures 2 and 3 are the ones for film cameras as described above, incidence angles of principal rays of light rays incident upon an image pickup surface is not necessarily designed so as to be sufficiently small on the periphery of the image pickup surface. In the image pickup lens for forming an object image onto a photoelectric conversion unit of a solid-state image sensor, when principal ray incidence angles of light rays incident upon the image pickup surface, i.e., the so-called telecentric characteristic, degrades, the light rays will enter obliquely to the solid-state image sensor, and a phenomenon (shading) occurs which decreases an effective aperture efficiency on the periphery of the image pickup surface, resulting in an insufficient quantity of light in the periphery.

Patent Literature 4 discloses an example of achieving higher performance by combining four lenses with a curved solid-state image sensor. However, because a lens nearest to the image side is a positive lens, a total length is long and the aberration correction is also insufficient as compared with the total length, and thus these examples cannot meet with the higher pixel density and larger aperture in recent years.

On the other hand, as a compact and high-performance lens, an image pickup lens comprising five lenses has been proposed because it can achieve higher performance as compared with an image pickup lens comprising three or four lenses.

Patent Literature 5 discloses the so-called telephoto type image pickup lens comprising, in order from an object side, a first lens having a positive refractive power, a second lens having a negative refractive power, a third lens having a positive refractive power, a fourth lens having a positive refractive power, and a fifth lens having a negative refractive power and attempting to reduce a total length of an image pickup lens (a distance on an optical axis from a lens surface on a side closest to an object of an entire system of an image pickup lens to an image side focal point).

However, with regard to the image pickup lens described in Patent Literature 5, principal ray incidence angles with respect to an image pickup surface is 26° or more at the maximum and the telecentric characteristic is not good, and furthermore a reduction of the total optical length is also insufficient and the F-number is also as slow as approximately F 3.0.

CITATION LIST

Patent Literature

PTL 1: Japanese Patent Laid-Open No. 2004-356175
PTL 2: Japanese Patent Laid-Open No. 08-68935
PTL 3: Japanese Patent Laid-Open No. 2000-292688
PTL 4: Japanese Patent Laid-Open No. 2006-184783
PTL 5: Japanese Patent Laid-Open No. 2011-95513

SUMMARY OF INVENTION

The present invention has been made in view of the above-described problems of the background arts, and provides a compact and high-performance image pickup lens and image pickup device comprising five lenses and also having a fast F-number of 2.8 or less and capable of suppressing shading by using a curved projection surface that is e.g. an image pickup surface of a solid-state image sensor.

Here, with regard to the scale of a compact image pickup lens, the present invention aims at miniaturization at a level satisfying the following conditional expression (9). By satisfying this range, a reduction in size and weight of the entire image pickup device can be achieved.

$$L/2Y<1.20 \tag{9}$$

Where L is a distance on an optical axis from a lens surface on a side closest to an object of an entire system of an image pickup lens to an image side focal point, and 2Y is a diagonal length of the projection surface of a solid-state image sensor (diagonal length of a rectangular effective pixel region of the solid-state image sensor). Here, the image side focal point refers to an image point when parallel light beams parallel to an optical axis are incident upon the image pickup lens.

When a parallel flat plate such as an optical low pass filter, an infrared cut filter, or a seal glass of a solid-state image sensor package, is disposed between the surface on a side closest to the image of the image pickup lens and the image side focal point position, the value of L described above is calculated on the assumption that a space of the parallel flat plate part is regarded as an air-equivalent distance. Moreover, in the case where the projection surface is curved, the diagonal length 2Y of the projection surface does not refer to a height from the optical axis but refers to a length of an arc along the curved projection surface.

More preferably, the present invention is directed to an image pickup lens satisfying a range of the following conditional expression (9)'.

$$L/2Y<1.10 \tag{9)'}$$

In order to solve the above-described problems, an image pickup lens according to the present invention is the one for forming an object image onto a projection surface provided in an image pickup device, wherein the projection surface is curved so as to lean to an object side in any cross section heading for a periphery of a picture plane or image area. The image pickup lens of the present invention includes, in order from the object side, a first lens having a positive refractive power, a second lens having a negative refractive power, a third lens having a positive or negative refractive power, a fourth lens having a positive or negative refractive power, and a fifth lens having at least one aspherical surface and having a negative refractive power. Furthermore, the image pickup lens of the present invention satisfies the following conditional expression (1):

$$-2.50<f5/f<-0.10 \tag{1}$$

where $f5$ is a focal length of the fifth lens and $f$ is a focal length of the entire system of the image pickup lens.

The image pickup lens of the present invention assumes that the projection surface is not curved only in a long side direction as with a conventional film camera but is a curved surface that leans to the object side in any cross section heading for the periphery of a picture plane.

Because the projection surface for image pickup is curved as with the case of curving the image pickup surface of a solid-state image sensor, both the miniaturization and higher performance can be achieved. When the projection surface is curved to the image pickup lens side, the correction of the principal ray incidence angles of light rays incident upon the projection surface, i.e., the correction of the so-called telecentric characteristic, can be advantageously conducted. That is, in the case where the projection surface is curved toward the image pickup lens side on the periphery, the principal ray incidence angles of light rays incident upon the projection surface becomes smaller than in the case where the projection surface is planar. Therefore, even if the telecentric characteristic is not fully corrected by the image pickup lens, the aperture efficiency will not decrease and the occurrence of shading can be suppressed. Moreover, the correction of field curvature, distortion aberration, coma aberration, and the like can be facilitated and the miniaturization becomes also possible. Here, the present invention assumes that the curved shape of the projection surface is curved so as to lean to the object side toward the periphery of a picture plane similarly both in the long side direction and in the short side direction of the picture plane. The curved shape of the projection surface does not necessarily need to be spherical, and any surface shape, such as an aspherical shape, a paraboloidal shape, and an XY polynomial shape, can be employed which can be expressed with an arbitrary mathematical expression. By fitting the curved shape of the projection surface to the shape of field curvature that is caused by a lens system, it becomes possible to improve the performance across the entire picture plane.

As described above, the image pickup lens of the present invention includes, in order from the object side, a first lens having a positive refractive power, a second lens having a negative refractive power, a third lens having a positive or negative refractive power, a fourth lens having a positive or negative refractive power, and a fifth lens having at least one aspherical surface and having a negative refractive power. This lens configuration of the so-called telephoto type including a positive group including the first lens, the second lens, the third lens, and the fourth lens and a negative group including the fifth lens is a configuration advantageous for achieving a reduction of the total length of an image pickup lens, i.e., the miniaturization of the image pickup lens and an image pickup device.

The conditional expression (1) is the one for appropriately setting the focal length of the fifth lens. When the value of the conditional expression (1) exceeds the lower limit, the negative focal length of the fifth lens will not be too small more than necessary and the telecentric characteristic on the periphery of a picture plane can be improved. On the other hand, when the value falls below the upper limit, the negative focal length of the fifth lens can be adequately reduced and the reduction of the total length of the image pickup lens and the correction of chromatic aberration can be advantageously conducted.

From the above view point, the value of $f5/f$ is more preferably set in the range of the following expression.

$$-2.40<f5/f<-0.30 \tag{1)'}$$

According to a specific aspect of the present invention, in the above-described image pickup lens, the curvature amount of the projection surface satisfies the following conditional expression (2):

$$0.05<SAGI/Y<1.50 \quad (2)$$

where SAGI is a displacement in the optical axis direction of the projection surface and Y is the maximum image height.

The conditional expression (2) is the one for appropriately setting the curvature amount of the projection surface. When the value thereof exceeds the lower limit, the curvature amount of the projection surface or the image pickup surface can be adequately maintained and an increase in the load to correct the telecentric characteristic and field curvature in the image pickup lens can be prevented. Therefore, a Petzval sum will not be too small and the coma aberration and chromatic aberration can be favorably corrected. On the other hand, when the value falls below the upper limit, excessive correction of field curvature due to too much increase of the curvature amount of the projection surface or the image pickup surface can be prevented. Moreover, the final surface of the image pickup lens and the projection surface can be prevented from approaching each other too close and an air spacing for inserting an IR (infrared ray) cut filter or the like can be sufficiently secured.

Here, the maximum image height Y refers not to the height from the optical axis, but to the length of an arc along the curved projection surface or image pickup surface.

From the above view point, the value of SAGI/Y is more preferably set in the range of the following expression.

$$0.10<SAGI/Y<1.20 \quad (2)'$$

According to another aspect of the present invention, the projection surface has a spherical shape and satisfies the following conditional expression (3):

$$-8.0<RI/Y<-1.0 \quad (3)$$

where RI is a curvature radius of the projection surface and Y is the maximum image height.

By setting the projection surface or the image pickup surface spherical, the projection surface will not have a complicated shape and the difficulty in a manufacturing process for curving the projection surface or image pickup surface can be reduced. The conditional expression (3) is the one for appropriately setting the curvature amount of the projection surface. When the value thereof exceeds the lower limit, the curvature amount of the projection surface can be adequately maintained and an increase in the load to correct the telecentric characteristic and field curvature in the image pickup lens can be prevented. Therefore, the Petzval sum will not be too small and the coma aberration and chromatic aberration can be favorably corrected. On the other hand, when the value falls below the upper limit, excessive correction of field curvature due to too much increase of the curvature amount of the projection surface can be prevented. Moreover, the final surface of the image pickup lens and the projection surface can be prevented from approaching each other too close and an air spacing for inserting a parallel flat plate such as an IR cut filter can be sufficiently secured. Also here, the maximum image height Y refers not to the height from the optical axis, but to the length of an arc along the curved projection surface or image pickup surface.

From the above view point, the value of RI/Y is more preferably set in the range of the following expression.

$$-7.0<RI/Y<-1.5 \quad (3)'$$

According to yet another aspect of the present invention, the first lens has a shape having a convex surface facing the object side and satisfies the following conditional expression (4):

$$0.4<f1/f<2.0 \quad (4)$$

where f1 is a focal length of the first lens and f is a focal length of the entire system of the image pickup lens.

The conditional expression (4) is the one for appropriately setting the focal length of the first lens and appropriately achieving a reduction of the total length of an image pickup lens and the aberration correction. When the value of the conditional expression (4) falls below the upper limit, the refractive power of the first lens can be adequately maintained. Thus, a composite principal point from the first lens to the third lens can be disposed closer to the object side and the total length of the image pickup lens can be reduced. On the other hand, when the value exceeds the lower limit, the refractive power of the first lens will not be too large more than necessary, and high order spherical aberration and coma aberration that are caused by the first lens can be minimized.

From the above view point, the value of f1/f is more preferably set in the range of the following expression.

$$0.5<f1/f<1.8 \quad (4)'$$

According to yet another aspect of the present invention, the second lens has a shape having a concave surface facing the image side and satisfies the following conditional expression (5):

$$0.50<(r3+r4)/(r3-r4)<2.00 \quad (5)$$

where r3 is a curvature radius of the object side surface of the second lens and r4 is a curvature radius of the image side surface of the second lens.

The conditional expression (5) is the one for appropriately setting a shaping factor of the second lens. When the value thereof exceeds the lower limit of the conditional expression (5), the principal point position of the second lens moves to the image side, and a principal point distance between the first lens and the second lens increases, and thus the refractive powers of the first lens and the second lens can be reduced while keeping the composite focal length of the first lens and the second lens. Thus, the occurrence of each aberration can be suppressed and furthermore the effect of a manufacture error can be reduced, and therefore mass productivity will improve. On the other hand, when the value falls below the upper limit of the conditional expression (5), the occurrence of high order aberration, such as coma and flare, due to an increase of the curvature radius of the image side surface can be suppressed.

From the above view point, the value of (r3+r4)/(r3−r4) is more preferably set in the range of the following expression.

$$0.70<(r3+r4)/(r3-r4)<1.90 \quad (5)'$$

According to yet another aspect of the present invention, the image pickup lens satisfies the following conditional expression (6):

$$0.10<fb/f<0.70 \quad (6)$$

where fb is a back focus of the image pickup lens and f is a focal length of the entire system of the image pickup lens.

The conditional expression (6) is the one for appropriately setting the back focus of the lens system. When the value thereof exceeds the lower limit, the lens nearest to the image side and the image pickup surface will not approach each other too close and a space for inserting a parallel plate can be secured. On the other hand, when the value falls below the upper limit, the back focus will not become too large more than necessary, and as a result the total length of an image pickup lens can be reduced.

Note that, here, when a parallel flat plate such as an optical low pass filter, an infrared cut filter, or a seal glass of a solid-state image sensor package, is disposed between the lens nearest to the image side and the image pickup surface, the back focus refers to a distance on an optical axis between the lens nearest to the image side and the image pickup surface on the assumption that a space of the parallel flat plate part is regarded as an air-equivalent distance.

From the above view point, the value of fb/f is more preferably set in the range of the following expression.

$$0.10 < fb/f < 0.65 \quad (6)'$$

According to yet another aspect of the present invention, the image side surface of the third lens has an aspherical shape and satisfies the following conditional expression (7):

$$0.20 < f/|f3| < 0.75 \quad (7)$$

where f is a focal length of the entire system of the image pickup lens and f3 is a focal length of the third lens.

The conditional expression (7) is the one for appropriately setting the focal length of the third lens, achieving both a reduction of the total length of an image pickup lens and the aberration correction, and minimizing a degradation in performance when a manufacture error occurs. By setting the focal length of the third lens in the range of the conditional expression (7), the refractive power of the third lens will not be too strong, the total length of the image pickup lens can be reduced, and the degradation in performance when a manufacture error occurs can be reduced. Because the image side surface of the third lens has an aspherical shape, the aberration correction on the periphery of a picture plane area can be favorably conducted while suppressing a paraxial refractive power of the third lens to an extent that the paraxial refractive power will not be too strong.

From the above view point, the value of f/|f3| is more preferably set in the range of the following expression.

$$0.30 < f/|f3| < 0.65 \quad (7)'$$

According to yet another aspect of the present invention, the image pickup lens satisfies the following conditional expression (8):

$$0.015 < PTZ/f < 0.045 \quad (8)$$

where PTZ is the Petzval sum of the entire system of the image pickup lens and f is a focal length of the entire system of the image pickup lens.

The conditional expression (8) is the one for appropriately setting the Petzval sum of the entire system of the image pickup lens and obtaining the amount of field curvature more suitable for the curved image pickup surface. Here, the Petzval sum of the entire system of the image pickup lens is given by the following expression.

$$PTZ = \sum_{j=1}^{k} \frac{1}{r_j} \left( \frac{1}{n_j} - \frac{1}{n'_j} \right)$$

Here, k is the number of lens surfaces, $r_j$ is the curvature radius of the j-th surface, $n_j$ is a refractive index on the incidence side of the j-th surface, and $n'_j$ is a refractive index of the exit side of the j-th surface.

When the value thereof exceeds the lower limit of the conditional expression (8), the Petzval sum is adequately increased and the field curvature is adequately generated, so that matching with the curved image surface and the performance favorable through the periphery can be obtained. On the other hand, when the value falls below the upper limit, the amount of field curvature that is caused by the lens system will not be too large, and thus the amount of field curvature can be prevented from being unable to be compensated by the curved image pickup surface.

From the above view point, the value of PTZ/f is more preferably set in the range of the following expression.

$$0.015 < PTZ/f < 0.040 \quad (8)'$$

According to yet another aspect of the present invention, an aperture stop is disposed nearer to the image side than the position on the optical axis of the object side surface of the first lens and also nearer to the object side than the most peripheral portion of the object side surface of the first lens. By disposing the aperture stop in this manner, it is possible to reduce the angle of refraction in the object side surface of the first lens, and therefore the occurrence of the high order spherical aberration and coma aberration that are caused by the first lens can be suppressed. Moreover, because the height of a light beam passing through the first lens can be reduced, the securing of an edge thickness of the first lens can be facilitated and the moldability can be improved. This requirement is particularly important in a large-aperture optical system.

According to yet another aspect of the present invention, an aperture stop is disposed between the first lens and the second lens. By disposing the aperture stop in this manner, the angle of refraction of a peripheral marginal light beam passing through the object side surface of the first lens will not be too large, and both the miniaturization of the image pickup lens and a favorable aberration correction can be achieved.

According to yet another aspect of the present invention, an aperture stop is disposed between the third lens and the fourth lens. By disposing the aperture stop between the third lens and the fourth lens in this manner, the entire lens system tends to be symmetric across the apertures, allowing for a configuration advantageous for aberration correction.

An image pickup device according to the present invention includes the above-described image pickup lens. By using the image pickup lens of the present invention, it is possible to provide a compact and high-performance image pickup device capable of suppressing shading.

BRIEF DESCRIPTION OF DRAWINGS

FIG. 2 is a cross sectional view of an image pickup lens of Example 1.

FIGS. 3A to 3E are aberration diagrams of the image pickup lens of Example 1.

FIG. 6 is a cross sectional view of an image pickup lens of Example 3.

DESCRIPTION OF EMBODIMENTS

Figure 1:
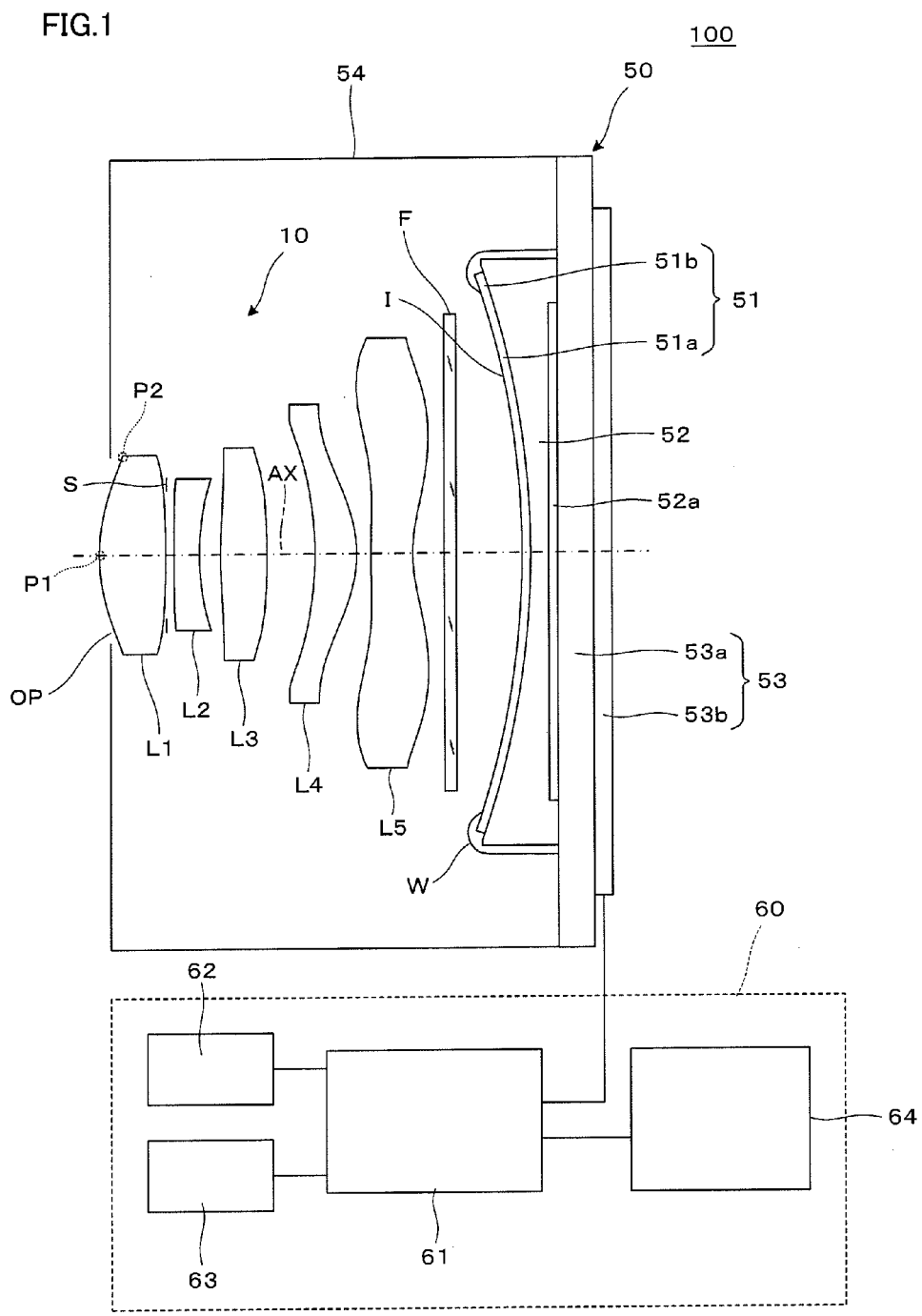
FIG. 1 is a view illustrating an image pickup device of an embodiment of the present invention.

FIG. 1 is a cross sectional view showing an image pickup device 100 according to an embodiment of the present invention. The image pickup device 100 includes an image pickup unit 50 for forming image signal and a processing unit 60 that exhibits a function as the image pickup device 100 by causing the image pickup unit 50 to operate appropriately.

The image pickup unit 50 includes: an image pickup lens 10 for forming an object image; a solid-state image sensor 51, which is a CMOS type image sensor, for detecting the object image formed by the image pickup lens 10; a support 52 for holding the solid-state image sensor 51 in a curved state; a substrate 53 supporting the support 52 from behind and having wirings and the like provided therein; and a light blocking enclosure 54 with an opening OP that causes light rays coming from an object side to be incident therethrough, wherein these are integrally formed.

The image pickup lens 10 includes, for example, in order from the object side, a first lens L1, an aperture stop S, a second lens L2, a third lens L3, a fourth lens L4, and a fifth lens L5.

The solid-state image sensor 51 includes a photoelectric conversion unit 51a as a light receiving unit, around which a signal processing circuit 51b is formed. The photoelectric conversion unit 51a has an image pickup surface I which is a projection surface and in which pixels (photoelectric conversion elements) are two-dimensionally arranged. Moreover, the signal processing circuit 51b includes, for example, a driving circuit unit to sequentially drive each pixel and obtain a signal charge, an A/D conversion unit to convert each signal charge to a digital signal, and the like. Note that, the solid-state image sensor 51 is not limited to the above-described CMOS type image sensor, but may be the one formed by applying a CCD and the like.

The support 52 is formed by a hard material, for example, and has a role to keep and fix the solid-state image sensor 51 in a concave shape that is symmetrically dent about an optical axis AX. Thus, the image pickup surface (projection surface) I of the solid-state image sensor 51 is in a curved state (specifically, results in a hemispherical concave surface) where the image pickup surface (projection surface) I leans to the image pickup lens 10 side so as to head for the central optical axis AX in any cross section including the optical axis AX. Note that, in the support 52, a signal processing circuit 52a having a function to control the operation of the signal processing circuit 51b can be formed.

The substrate 53 includes: a main body portion 53a for supporting the support 52 and the enclosure 54 to one surface side; and a flexible printed circuit board 53b having one end connected to the other surface side of the main body portion 53a. The main body portion 53a is connected to the solid-state image sensor 51 via a bonding wire W on the above-described one surface side, and is connected to the flexible printed circuit board 53b on the above-described other surface side.

Note that, the flexible printed circuit board 53b connects the main body portion 53a to a non-illustrated external circuit (e.g., a control circuit which a host having the image pickup unit 50 mounted thereon includes), allowing the reception of a supply of a voltage and a clock signal for driving the solid-state image sensor 51 from the external circuit and also allowing the digital pixel signals such YUV or the like to be output to the external circuit.

The enclosure 54 houses and holds the image pickup lens 10. The enclosure 54 is provided so as to cover the solid-state image sensor 51 in a surface on the solid-state image sensor 51 side of the substrate 53. That is, the enclosure 54 is, on the rear side thereof, widely opened and fixed to a support substrate 52a so as to surround the solid-state image sensor 51, while on the front side it is formed into a flanged cylindrical shape having the opening OP of a predetermined size. Inside the enclosure 54, a parallel plate F having a function to cut infrared light is fixed and disposed while being pinched between the main body of the image pickup lens 10 and the solid-state image sensor 51. The parallel plate F is supported by the enclosure 54 as with the image pickup lens 10.

The processing unit 60 includes a control unit 61, an input unit 62, a storage unit 63, and a display unit 64. The control unit 61 causes the image pickup unit 50 to perform an image pickup operation. The input unit 62 is a portion for receiving an operation of a user. The storage unit 63 is a portion for storing the information needed for the operation of the image pickup device 100, the image data acquired by the image pickup unit 50, and the like. The display unit 64 is a portion for displaying the information, a captured image, and the like to be presented to a user. The control unit 61 can perform, for example, various types of image processing on the image data acquired by the image pickup unit 50.

Note that, although the detailed description is omitted, the specific function of the processing unit 60 is appropriately adjusted depending on which one of a digital camera, a mobile telephone, a PDA, or the like the image pickup device 100 is to be incorporated into.

Hereinafter, the image pickup lens 10 of the embodiment is described with reference to FIG. 1. Note that the image pickup lens 10 illustrated in FIG. 1 has the same configuration as an image pickup lens 12 of Example 2 to be described later.

As shown in FIG. 1, the image pickup lens 10 of the embodiment forms an object image onto the solid-state image sensor 51, and includes the aperture stop S, the first lens L1 having a positive refractive power, the second lens L2 having a negative refractive power, the third lens L3 having a positive or negative refractive power, the fourth lens L4 having a positive or negative refractive power, and the fifth lens L5 having a negative refractive power. Among these lenses, with regard to the fifth lens L5, at least one surface is aspherical and the other surface (e.g., an image side surface of the third lens L3) constituting the image pickup lens 10 can be also aspherical. The image pickup lens 10 can include, for example, the parallel plate F as an optical element having substantially no power. The image pickup surface I of the solid-state image sensor 51 is curved in a shallow concave spherical shape, and is a surface of revolution having symmetry about the optical axis AX.

The image pickup surface (projection surface) I of the solid-state image sensor 51, on which image light collected by the image pickup lens 10 is incident, is curved, so that both the miniaturization and the higher performance of the image pickup lens 10 and the like can be achieved. Specifically, because the image pickup surface I is curved toward the image pickup lens 10 side on the periphery, the principal ray incidence angles of light rays incident upon the image pickup surface I decreases, and therefore even if the telecentric characteristic is not fully corrected by the image pickup lens 10, the aperture efficiency will not decrease and the occurrence of shading can be suppressed. Moreover, the correction of field curvature, distortion aberration, coma aberration, and the like can be facilitated and the miniaturization of the image pickup lens 10 and the like becomes also possible.

In the image pickup lens 10 of the present embodiment, a positive group including the first lens L1, the second lens L2, the third lens L3, and the fourth lens L4 is disposed on the object side, and a negative group including the fifth lens L5 is disposed on the image side. This lens configuration of the telephoto type is advantageous for reducing the total length of the image pickup lens 10.

The above image pickup lens 10 satisfies the previously described conditional expression (1):

$$-2.50 < f5/f < -0.10 \quad (1)$$

where f5 is a focal length of the fifth lens L5, and f is a focal length of the entire system of the image pickup lens 10.

The conditional expression (1) is the one for appropriately setting the focal length of the fifth lens L5. When the value of the conditional expression (1) exceeds the lower limit, the negative focal length of the fifth lens L5 will not be too small more than necessary and the telecentric characteristic on the periphery of a picture plane can be improved. On the other hand, when the value falls below the upper limit, the negative focal length of the fifth lens L5 can be adequately reduced and the reduction of the total length of the image pickup lens 10 and the correction of chromatic aberration can be advantageously conducted.

The image pickup lens 10 more preferably satisfies the following expression (1)', which further limits the above-described conditional expression (1).

$$-2.40 < f5/f < -0.30 \quad (1)'$$

The image pickup lens 10 of the embodiment satisfies the previously described conditional expression (2) in addition to the above-described conditional expression (1).

$$0.05 < SAGI/Y < 1.50 \quad (2)$$

Here, SAGI is a displacement in the optical axis AX direction of the image pickup surface (projection surface) I, and Y is a maximum image height.

The image pickup lens 10 more preferably satisfies the following expression (2)', which further limits the above-described conditional expression (2).

$$0.10 < SAGI/Y < 1.20 \quad (2)'$$

The image pickup lens 10 of the embodiment satisfies the previously described conditional expression (3) in addition to the above-described conditional expression (1).

$$-8.0 < RI/Y < -1.0 \quad (3)$$

Here, RI is a curvature radius of the image pickup surface (projection surface) I, and Y is the maximum image height.

The image pickup lens 10 more preferably satisfies the following expression (3)', which further limits the above-described conditional expression (3).

$$-7.0 < RI/Y < -1.5 \quad (3)'$$

The image pickup lens 10 of the embodiment satisfies the previously described conditional expression (4) in addition to the above-described conditional expression (1).

$$0.4 < f1/f < 2.0 \quad (4)$$

Here, f1 is a focal length of the first lens L1, and f is the focal length of the entire system of the image pickup lens 10 as previously stated.

The image pickup lens 10 more preferably satisfies the following expression (4)', which further limits the above-described conditional expression (4).

$$0.5 < f1/f < 1.8 \quad (4)'$$

The image pickup lens 10 of the embodiment satisfies the previously described conditional expression (5) in addition to the above-described conditional expression (1).

$$0.50 < (r3+r4)/(r3-r4) < 2.00 \quad (5)$$

Here, r3 is a curvature radius of the object side surface of the second lens L2, and r4 is a curvature radius of the image side surface of the second lens L2.

The image pickup lens 10 more preferably satisfies the following expression (5)', which further limits the above-described conditional expression (5).

$$0.70 < (r3+r4)/(r3-r4) < 1.90 \quad (5)'$$

The image pickup lens 10 of the embodiment satisfies the previously described conditional expression (6) in addition to the above-described conditional expression (1).

$$0.10 < fb/f < 0.70 \quad (6)$$

Here, fb is a back focus of the image pickup lens 10.

The image pickup lens 10 more preferably satisfies the following expression (6)', which further limits the above-described conditional expression (6).

$$0.10 < fb/f < 0.65 \quad (6)'$$

With regard to the image pickup lens 10 of the embodiment, the image side surface of the third lens L3 has an aspherical shape, and satisfies the previously described conditional expression (7) in addition to the above-described conditional expression (1).

$$0.20 < f/|f3| < 0.75 \quad (7)$$

Here, f3 is a focal length of the third lens L3.

The image pickup lens 10 more preferably satisfies the following expression (7)', which further limits the above-described conditional expression (7).

$$0.30 < f/|f3| < 0.65 \quad (7)'$$

The image pickup lens 10 of the embodiment satisfies the previously described conditional expression (8) in addition to the above-described conditional expression (8).

$$0.015 < PTZ/f < 0.045 \quad (8)$$

Here, PTZ is a Petzval sum of the entire image pickup lens 10 system.

The image pickup lens 10 more preferably satisfies the following expression (8)', which further limits the above-described conditional expression (8).

$$0.015 < PTZ/f < 0.040 \quad (8)'$$

As shown in FIG. 1, the aperture stop S is disposed between the first lens L1 and the second lens L2. By disposing the aperture stop S in this manner, the angle of refraction of a peripheral marginal light beam passing through the object side surface of the first lens L1 will not be too large, and both the miniaturization of the image pickup lens 10 and a favorable aberration correction can be achieved.

Note that the aperture stop S may be disposed nearer to the image side than a position P1 on the optical axis AX of the object side surface of the first lens L1 and also nearer to the object side than the most peripheral portion P2 of the object side surface of the first lens L1. Thus, the occurrence of the high order spherical aberration and coma aberration that are caused by the first lens L1 can be suppressed. By reducing the height of a light beam passing through the first lens L1, the edge thickness of the first lens L1 is secured and the moldability is improved.

EXAMPLES

Hereinafter, the examples of the image pickup lens of the present invention are shown. Symbols used in each example are as follows:

f: a focal length of the entire system of the image pickup lens
fb: back focus,
F: F-number,
2Y: diagonal length of the image pickup surface of the solid-state image sensor,
ENTP: entrance pupil position (distance from the first surface to the entrance pupil position),
EXTP: exit pupil position (distance from the image pickup surface to the exit pupil position),
H1: front-side principal point position (distance from the first surface to the front-side principal point position),
H2: back-side principal point position (distance from the final surface to the back-side principal point position),
R: curvature radius,
D: axial surface distance,
Nd: the refractive index with respect to a d-line of a lens material, and
vd: Abbe number of a lens material.

In each example, a surface of each surface number suffixed with "*" is the surface having an aspherical shape, and the aspherical shape is expressed by the following "Formula 1", with the vertex of a surface taken as a point of origin, the X-axis taken in the optical axis AX direction, and a height in a direction perpendicular to the optical axis AX denoted by h:

$$X = \frac{h^2/R}{1+\sqrt{1-(1+K)h^2/R^2}} + \sum A_i h^i \quad \text{[Formula 1]}$$

where $A_i$ is an i-th aspherical surface coefficient, R is a curvature radius, and K is a conic constant.

Example 1

The general specifications of an image pickup lens of Example 1 are shown below.
f=4.23 mm
fb=0.64 mm
F=2.8
2Y=7.128 mm
ENTP=0 mm
EXTP=−2.46 mm
H1=−1.55 mm
H2=−3.59 mm The data of the lens surfaces of Example 1 is shown in Table 1 below. Note that the STOP means the aperture stop S and the image means the image pickup surface I.

TABLE 1

| Surface No. | R (mm) | D (mm) | Nd | vd | Effective radius (mm) |
|---|---|---|---|---|---|
| 1 (STOP) | infinity | −0.11 | | | 0.76 |
| 2* | 1.884 | 0.51 | 1.54470 | 56.2 | 0.76 |

TABLE 1-continued

| Surface No. | R (mm) | D (mm) | Nd | vd | Effective radius (mm) |
|---|---|---|---|---|---|
| 3* | −45.319 | 0.06 | | | 0.82 |
| 4* | 8.277 | 0.23 | 1.63470 | 23.9 | 0.86 |
| 5* | 2.311 | 0.41 | | | 0.93 |
| 6* | 7.490 | 0.56 | 1.54470 | 56.2 | 1.38 |
| 7* | infinity | 0.48 | | | 1.43 |
| 8* | −15.081 | 0.48 | 1.54470 | 56.2 | 1.67 |
| 9* | −2.721 | 1.12 | | | 2.01 |
| 10* | −2.998 | 0.54 | 1.53050 | 55.7 | 2.93 |
| 11* | 11.833 | 0.62 | | | 3.16 |
| IMAGE | −15.000 | | | | |

The aspherical surface coefficients of the lens surfaces of Example 1 are shown in Table 2 below.

TABLE 2

Second surface

K = −0.20272E−01, A4 = 0.21761E−02, A6 = 0.19366E−01,
A8 = −0.41471E−01, A10 = 0.98748E−02, A12 = 0.71809E−01,
A14 = −0.65602E−01
Third surface K = 0.30000E+02, A4 = 0.31067E−01, A6 = −0.21519E−01,
A8 = 0.78950E−02, A10 = 0.10978E−02, A12 = −0.38078E−01,
A14 = 0.42116E−01
Fourth surface K = −0.11802E+02, A4 = −0.21046E−01, A6 = 0.47780E−01,
A8 = −0.72465E−01, A10 = 0.71978E−02, A12 = 0.65257E−01,
A14 = −0.35582E−01
Fifth surface K = −0.10927E+02, A4 = 0.67528E−01, A6 = 0.62994E−02,
A8 = −0.24145E−01, A10 = 0.16680E−01, A12 = 0.84368E−02,
A14 = −0.62737E−02
Sixth surface K = 0.22585E+02, A4 = −0.34345E−01, A6 = 0.43294E−02,
A8 = 0.17186E−01, A10 = −0.11446E−01, A12 = 0.52380E−02,
A14 = −0.10561E−02
Seventh surface K = 0.0, A4 = −0.43789E−01, A6 = 0.66696E−02, A8 = −0.44142E−02,
A10 = 0.28354E−02, A12 = 0.12391E−02, A14 = −0.12019E−03
Eighth surface K = −0.25247E+02, A4 = −0.22966E−01, A6 = 0.10703E−01,
A8 = −0.64318E−02, A10 = −0.13726E−03, A12 = 0.67066E−03,
A14 = −0.10982E−03
Ninth surface K = −0.62257E+01, A4 = −0.19084E−01, A6 = 0.19780E−01,
A8 = −0.30251E−02, A10 = −0.20296E−03, A12 = 0.54352E−04,
A14 = −0.30457E−05
Tenth surface K = −0.21964E+01, A4 = −0.17840E−01, A6 = 0.43295E−02,
A8 = 0.39813E−06, A10 = −0.32980E−04, A12 = 0.57871E−06,
A14 = 0.77501E−07
Eleventh surface K = 0.37078E+01, A4 = −0.27884E−01, A6 = 0.36214E−02,
A8 = −0.50977E−03, A10 = 0.39976E−04, A12 = −0.12880E−05,
A14 = 0.21403E−07

Note that, hereinafter (including the lens data of the tables), the power of 10 (e.g., 2.5 × $10^{-02}$) is expressed with E (e.g., 2.5E−02).

The data of single-lenses of Example 1 is shown in Table 3 below.

TABLE 3

| Lens | First surface | Focal length (mm) |
|---|---|---|
| 1 | 2 | 3.333 |
| 2 | 4 | −5.127 |
| 3 | 6 | 13.752 |
| 4 | 8 | 6.014 |
| 5 | 10 | −4.452 |

FIG. 2 is a cross sectional view of an image pickup lens 11 or the image pickup unit 50 of Example 1. The image pickup lens 11 includes the first lens L1 having a positive refractive power and being convex on both sides, the second meniscus lens L2 having a negative refractive power and being convex on the object side, the third lens L3 having a positive refractive power and being convex on the object side, the fourth meniscus lens L4 having a positive refractive power and being convex on the image side, and the fifth lens L5 having a negative refractive power and being concave on both sides. All the lenses L1 to L5 are formed from plastic materials. The aperture stop S is disposed on the object side of the first lens L1. In the present example, the image pickup surface I has a spherical shape. Note that, between the light exit surface of the fifth lens L5 and the concave image pickup surface I, the parallel plate F shown in FIG. 1 can be disposed.

FIGS. 3A to 3C show the aberration diagrams (spherical aberration, astigmatic aberration and distortion aberration) of the image pickup lens 11 of Example 1, while FIGS. 3D and 3E show the meridional coma aberration of the image pickup lens 11 of Example 1.

Example 2

The general specifications of an image pickup lens of Example 2 are shown below.
f=3.77 mm
fB=0.78 mm
F=2.22
2Y=5.744 mm
ENTP=0.59 mm
EXTP=−2.47 mm
H1=−0.02 mm
H2=−2.99 mm The data of the lens surfaces of Example 2 are shown in Table 4 below.

TABLE 4

| Surface No. | R (mm) | D (mm) | Nd | ν d | Effective radius (mm) |
|---|---|---|---|---|---|
| 1 | infinity | 0.00 | | | 1.43 |
| 2* | 2.246 | 0.79 | 1.54470 | 56.2 | 1.19 |
| 3* | −12.110 | 0.01 | | | 0.90 |
| 4 (STOP) | infinity | 0.09 | | | 0.77 |
| 5* | 34.556 | 0.30 | 1.63200 | 23.4 | 0.79 |
| 6* | 3.139 | 0.25 | | | 0.91 |
| 7* | 6.535 | 0.54 | 1.54470 | 56.2 | 1.08 |
| 8* | −12.582 | 0.57 | | | 1.27 |
| 9* | −3.876 | 0.49 | 1.54470 | 56.2 | 1.59 |
| 10* | −1.471 | 0.17 | | | 1.78 |
| 11* | 9.065 | 0.51 | 1.54470 | 56.2 | 2.34 |
| 12* | 1.755 | 0.37 | | | 2.56 |
| 13 | infinity | 0.15 | 1.51630 | 64.1 | 2.79 |
| 14 | infinity | 0.77 | | | 2.84 |
| IMAGE | −10.346 | | | | |

The aspherical surface coefficients of the lens surfaces of Example 2 are shown in Table 5 below.

TABLE 5

Second surface

K = −0.45246E+00, A4 = −0.10932E−01, A6 = 0.36384E−02,
A8 = −0.18871E−01, A10 = 0.12051E−01, A12 = −0.44115E−02,
A14 = 0.10313E−03
Third surface K = 0.49619E+02, A4 = −0.36300E−01, A6 = 0.10895E+00,
A8 = −0.19197E+00, A10 = 0.19397E+00, A12 = −0.11550E+00,
A14 = 0.28105E−01
Fifth surface K = 0.40042E+01, A4 = −0.49226E−01, A6 = 0.18739E+00,
A8 = −0.21870E+00, A10 = 0.13043E+00, A12 = −0.33590E−01,
A14 = −0.18412E−03
Sixth surface K = −0.95512E+01, A4 = −0.93803E−02, A6 = 0.11060E+00,
A8 = −0.81446E−01, A10 = 0.22637E−01, A12 = −0.65756E−02,
A14 = 0.59251E−02
Seventh surface K = 0.24268E+02, A4 = −0.64209E−01, A6 = −0.91824E−02,
A8 = 0.48691E−01, A10 = −0.69118E−01, A12 = 0.52774E−01,
A14 = −0.16442E−01
Eighth surface K = −0.25925E+02, A4 = −0.37441E−01, A6 = 0.27196E−02,
A8 = −0.19187E−01, A10 = 0.89742E−02, A12 = 0.23239E−02,
A14 = −0.68528E−03
Ninth surface K = 0.33241E+01, A4 = 0.15964E−01, A6 = 0.84941E−02,
A8 = −0.64774E−02, A10 = −0.14912E−02, A12 = 0.17909E−02,
A14 = −0.24621E−03
Tenth surface K = −0.49008E+01, A4 = −0.43541E−01, A6 = 0.32728E−01,
A8 = −0.30077E−02, A10 = −0.99776E−04, A12 = −0.37246E−03,
A14 = 0.81688E−04
Eleventh surface K = 0.39174E+01, A4 = −0.93039E−01, A6 = 0.23650E−01,
A8 = −0.45756E−03, A10 = −0.57828E−03, A12 = 0.80939E−04,
A14 = −0.32607E−05
Twelfth surface K = −0.92347E+01, A4 = −0.54027E−01, A6 = 0.13428E−01,
A8 = −0.25193E−02, A10 = 0.26760E−03, A12 = −0.99631E−05,
A14 = −0.67193E−07

The data of single-lenses of Example 2 is shown in Table 6 below.

TABLE 6

| Lens | First surface | Focal length (mm) |
|---|---|---|
| 1 | 2 | 3.547 |
| 2 | 5 | −5.483 |
| 3 | 7 | 7.976 |
| 4 | 9 | 4.061 |
| 5 | 11 | −4.095 |

Figure 4:
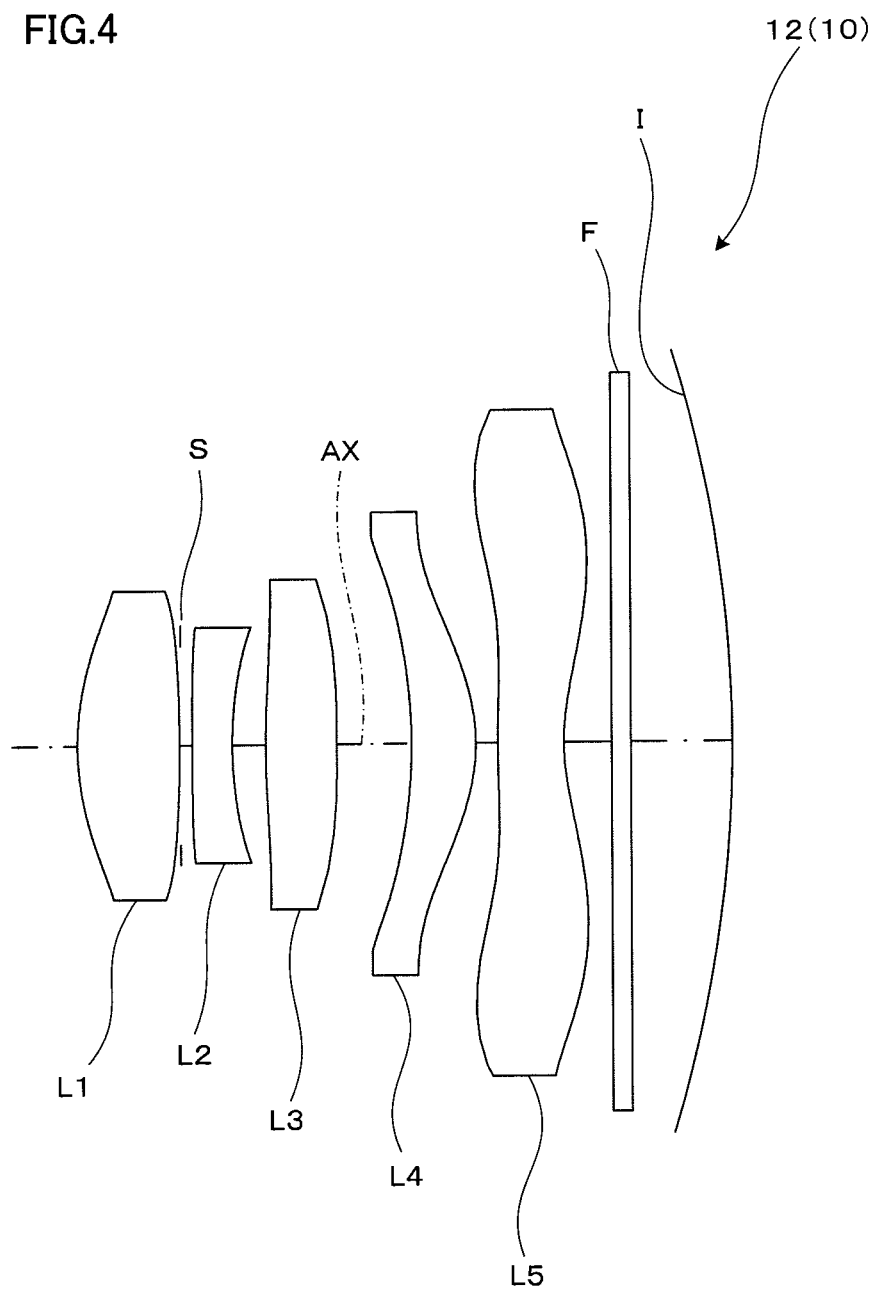
FIG. 4 is a cross sectional view of an image pickup lens of Example 2.

FIG. 4 is a cross sectional view of an image pickup lens 12 or the image pickup unit 50 of Example 2. The image pickup lens 12 includes the first lens L1 having a positive refractive power and being convex on both sides, the second meniscus lens L2 having a negative refractive power and being convex on the object side, the third lens L3 having a positive refractive power and being convex on both sides, the fourth meniscus lens L4 having a positive refractive power and being convex on the image side, and the fifth meniscus lens L5 having a negative refractive power and being convex on the object side. All the lenses L1 to L5 are formed from plastic materials. The aperture stop S is disposed between the first lens L1 and the second lens L2. In the present example, the image pickup surface I has a spherical shape. Note that, between the light exit surface of the fifth lens L5 and the concave image pickup surface I, the parallel plate F, which is an IR cut filter or the like, is disposed.

Figure 5A:
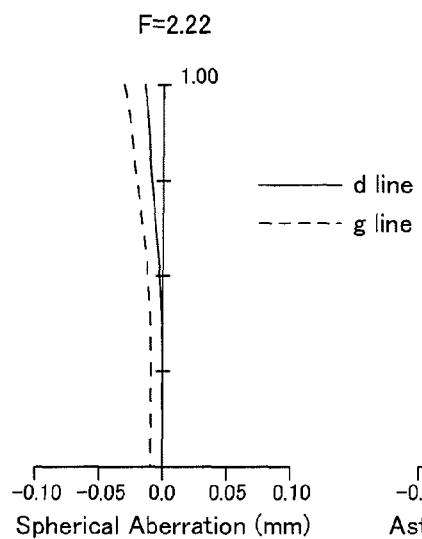
FIGS. 5A to 5E are aberration diagrams of the image pickup lens of Example 2.
Figure 5B:
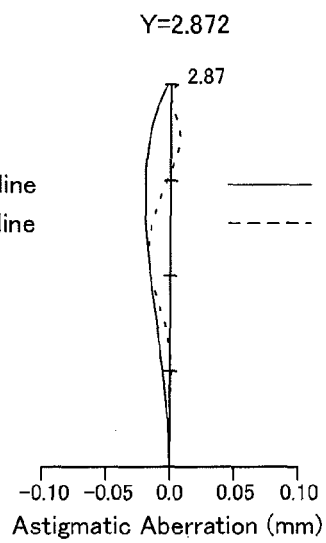
Figure 5C:
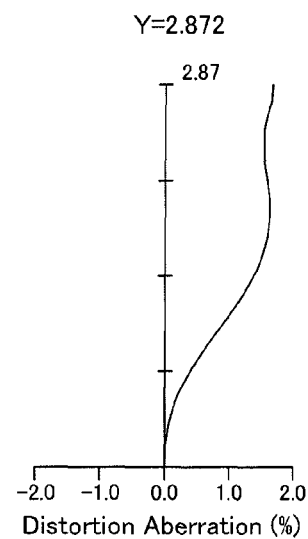
Figure 5D:
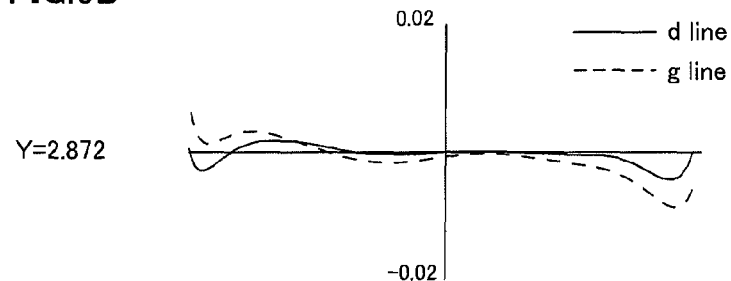
Figure 5E:
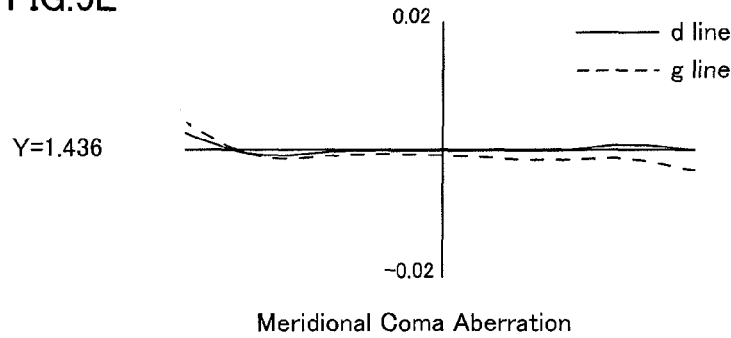

FIGS. 5A to 5C show the aberration diagrams (spherical aberration, astigmatic aberration and distortion aberration) of the image pickup lens 12 of Example 2, while FIGS. 5D and 5E show the meridional coma aberration of the image pickup lens 12 of Example 2.

Example 3

The general specifications of an image pickup lens of Example 3 are shown below.
f=3.66 mm
fB=0.85 mm
F=2.4
2Y=5.71 mm
ENTP=0 mm
EXTP=−1.81 mm
H1=−1.38 mm
H2=−2.81 mm The data of the lens surfaces of Example 3 is shown in Table 7 below.

TABLE 7

| Surface No. | R (mm) | D (mm) | Nd | ν d | Effective radius (mm) |
|---|---|---|---|---|---|
| 1 (STOP) | infinity | −0.06 | | | 0.76 |
| 2* | 1.720 | 0.57 | 1.54470 | 56.2 | 0.79 |
| 3* | −9.054 | 0.08 | | | 0.81 |
| 4* | −33.924 | 0.27 | 1.63470 | 23.9 | 0.80 |
| 5* | 3.178 | 0.29 | | | 0.85 |
| 6* | 5.525 | 0.48 | 1.54470 | 56.2 | 1.08 |
| 7* | infinity | 0.56 | | | 1.20 |
| 8* | −6.135 | 0.50 | 1.54470 | 56.2 | 1.36 |
| 9* | −1.134 | 0.22 | | | 1.76 |
| 10* | −1.606 | 0.51 | 1.53180 | 56.0 | 2.03 |
| 11* | 2.665 | 0.85 | | | 2.34 |
| IMAGE | −17.923 | | | | |

The aspherical surface coefficients of the lens surfaces of Example 3 are shown in Table 8 below.

TABLE 8

Second surface

K = −0.75132E+00, A4 = −0.16106E−01, A6 = −0.74358E−02, A8 = −0.14477E+00, A10 = 0.18711E+00, A12 = −0.17476E+00
Third surface K = 0.30000E+02, A4 = −0.74079E−01, A6 = 0.75740E−01, A8 = −0.25801E+00, A10 = 0.13961E+00
Fourth surface K = −0.30000E+02, A4 = −0.24920E−01, A6 = 0.24525E+00, A8 = −0.41253E+00, A10 = 0.26638E+00
Fifth surface K = −0.29129E+02, A4 = 0.10348E+00, A6 = 0.69009E−01, A8 = 0.27019E−02, A10 = −0.10666E+00, A12 = 0.95099E−01
Sixth surface K = −0.30000E+02, A4 = −0.11318E+00, A6 = 0.61724E−01, A8 = −0.41786E−01, A10 = 0.40932E−01, A12 = 0.68663E−01, A14 = −0.44680E−01
Seventh surface TABLE 8-continued K = 0.0, A4 = −0.11322E+00, A6 = 0.12944E−01, A8 = −0.19284E−01, A10 = 0.11119E−01, A12 = 0.10976E−01, A14 = 0.12316E−01, A16 = −0.23129E−02
Eighth surface K = −0.30000E+02, A4 = −0.81070E−01, A6 = 0.12107E−01, A8 = 0.57044E−02, A10 = −0.27163E−01, A12 = 0.31239E−02, A14 = 0.78774E−02, A16 = −0.21597E−02
Ninth surface K = −0.42975E+01, A4 = −0.69868E−01, A6 = 0.76015E−01, A8 = −0.15567E−01, A10 = −0.16435E−02, A12 = 0.34413E−03, A14 = 0.16006E−03, A16 = −0.36705E−04
Tenth surface K = −0.73593E+01, A4 = −0.80461E−01, A6 = 0.30333E−01, A8 = 0.11607E−02, A10 = −0.10572E−02, A12 = −0.94938E−04, A14 = 0.34068E−04, A16 = −0.56844E−06
Eleventh surface K = −0.28203E+02, A4 = −0.46691E−01, A6 = 0.99459E−02, A8 = −0.30392E−02, A10 = 0.52059E−03, A12 = −0.32382E−04, A14 = −0.78153E−05, A16 = 0.12490E−05

The data of single-lenses of Example 3 is shown in Table 9 below.

TABLE 9

| Lens | First surface | Focal length (mm) |
|---|---|---|
| 1 | 2 | 2.705 |
| 2 | 4 | −4.565 |
| 3 | 6 | 10.144 |
| 4 | 8 | 2.466 |
| 5 | 10 | −1.809 |

FIG. 6 is a cross sectional view of an image pickup lens 13 or the image pickup unit 50 of Example 3. The image pickup lens 13 includes the first lens L1 having a positive refractive power and being convex on both sides, the second lens L2 having a negative refractive power and being concave on both sides, the third lens L3 having a positive refractive power and being convex on the object side, the fourth meniscus lens L4 having a positive refractive power and being convex on the image side, and the fifth lens L5 having a negative refractive power and being concave on both sides. All the lenses L1 to L5 are formed from plastic materials. The aperture stop S is disposed on the object side of the first lens L1. In the present example, the image pickup surface I has a spherical shape. Note that, between the light exit surface of the fifth lens L5 and the concave image pickup surface I, the parallel plate F shown in FIG. 1 can be disposed.

Figure 7A:
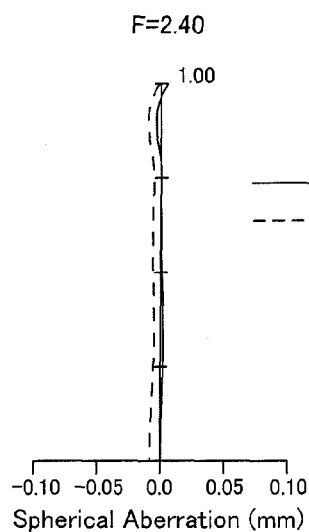
FIGS. 7A to 7E are aberration diagrams of the image pickup lens of Example 3.
Figure 7B:
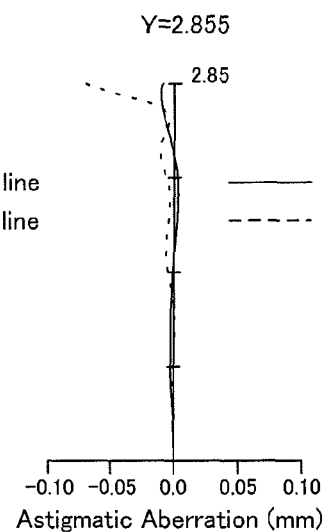
Figure 7C:
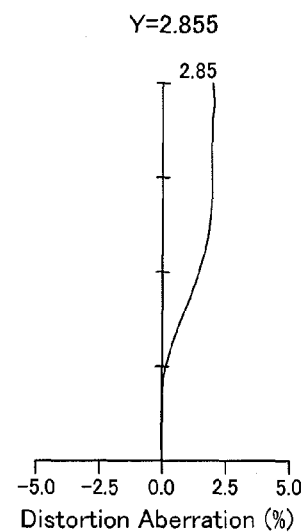
Figure 7D:
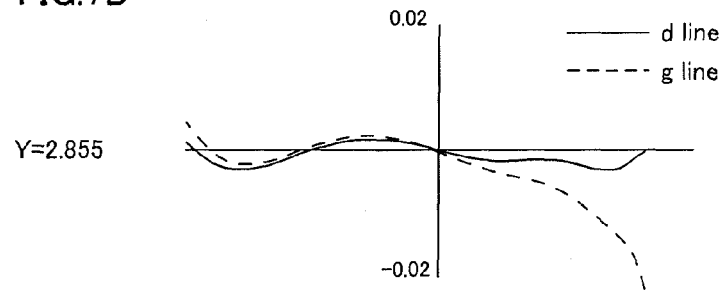
Figure 7E:
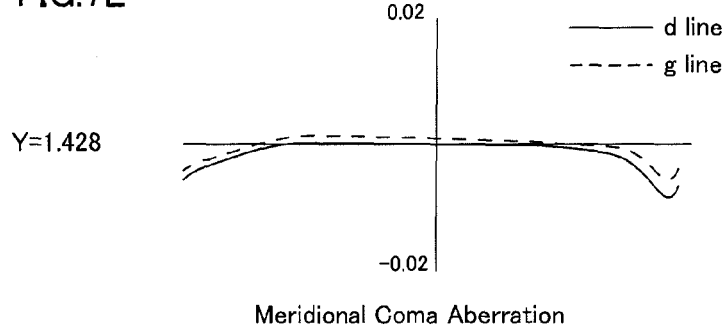

FIGS. 7A to 7C show the aberration diagrams (spherical aberration, astigmatic aberration and distortion aberration) of the image pickup lens 13 of Example 3, while FIGS. 7D and 7E show the meridional coma aberration of the image pickup lens 13 of Example 3.

Example 4

The general specifications of an image pickup lens of Example 4 are shown below.
f=6.34 mm
fB=2.1 mm
F=1.8
2Y=8 mm
ENTP=2.49 mm
EXTP=−4 mm H1=2.24 mm
H2=-4.24 mm The data of the lens surfaces of Example 4 is shown in Table 10 below.

TABLE 10

| Surface No. | R (mm) | D (mm) | Nd | ν d | Effective radius (mm) |
|---|---|---|---|---|---|
| 1 | infinity | 0.00 | | | 3.51 |
| 2* | 4.823 | 1.02 | 1.54470 | 56.2 | 3.02 |
| 3* | 22.519 | 0.10 | | | 2.79 |
| 4* | 26.718 | 0.50 | 1.63470 | 23.9 | 2.66 |
| 5* | 7.373 | 0.10 | | | 2.26 |
| 6* | 8.576 | 1.06 | 1.54470 | 56.2 | 2.13 |
| 7* | -20.787 | 0.12 | | | 1.72 |
| 8 (STOP) | infinity | 0.54 | | | 1.45 |
| 9* | -215.025 | 1.81 | 1.54470 | 56.2 | 1.76 |
| 10* | -3.552 | 0.10 | | | 2.30 |
| 11* | -3.125 | 0.48 | 1.63470 | 23.9 | 2.42 |
| 12* | -4.964 | 1.28 | | | 2.68 |
| 13 | infinity | 0.30 | 1.51630 | 64.1 | 3.55 |
| 14 | infinity | 2.10 | | | 3.65 |
| IMAGE | -7.960 | | | | |

The aspherical surface coefficients of the lens surfaces of Example 4 are shown in Table 11 below.

[Table 11]
Second surface
K=-0.98021E+00, A4=-0.13550E-02, A6=-0.21549E-03, A8=-0.11299E-04, A10=0.15262E-06, A12=0.16640E-07
Third surface
K=-0.47977E+02, A4=-0.10976E-02, A6=0.10689E-03, A8=-0.56468E-06, A10=-0.15273E-05, A12=0.24576E-07
Fourth surface
K=0.25389E+02, A4=0.29782E-03, A6=-0.20468E-03, A8=-0.19191E-06, A10=0.42780E-05, A12=-0.13211E-06
Fifth surface
K=0.20238E+01, A4=0.10550E-03, A6=-0.17248E-03, A8=0.34116E-04, A10=-0.10149E-04, A12=0.13595E-05
Sixth surface
K=0.11217E+02, A4=0.51395E-03, A6=0.11592E-02, A8=-0.21566E-05, A10=-0.59504E-05
Seventh surface
K=-0.18723E+02, A4=0.23481E-02, A6=0.78826E-03, A8=-0.38120E-04, A10=0.43611E-05
Ninth surface
K=0.50000E+02, A4=-0.37361E-02, A6=-0.39584E-03, A8=-0.50882E-03, A10=0.17560E-03, A12=-0.46005E-04
Tenth surface
K=0.66095E+00, A4=-0.22804E-02, A6=0.44448E-03, A8=-0.40727E-04, A10=0.76468E-05, A12=-0.25651E-05
Eleventh surface
K=-0.11279E+01, A4=0.49302E-02, A6=-0.12008E-03, A8=0.83824E-05, A10=0.78230E-07, A12=0.80519E-06
Twelfth surface
K=-0.59055E+01, A4=0.44021E-02, A6=-0.10967E-03, A8=-0.17941E-04, A10=0.29445E-04, A12=-0.20180E-07

The data of single-lenses of Example 4 is shown in Table 12 below.

TABLE 12

| Lens | First surface | Focal length (mm) |
|---|---|---|
| 1 | 2 | 11.044 |
| 2 | 4 | -16.207 |
| 3 | 6 | 11.290 |
| 4 | 9 | 6.610 |
| 5 | 11 | -14.777 |

Figure 8:
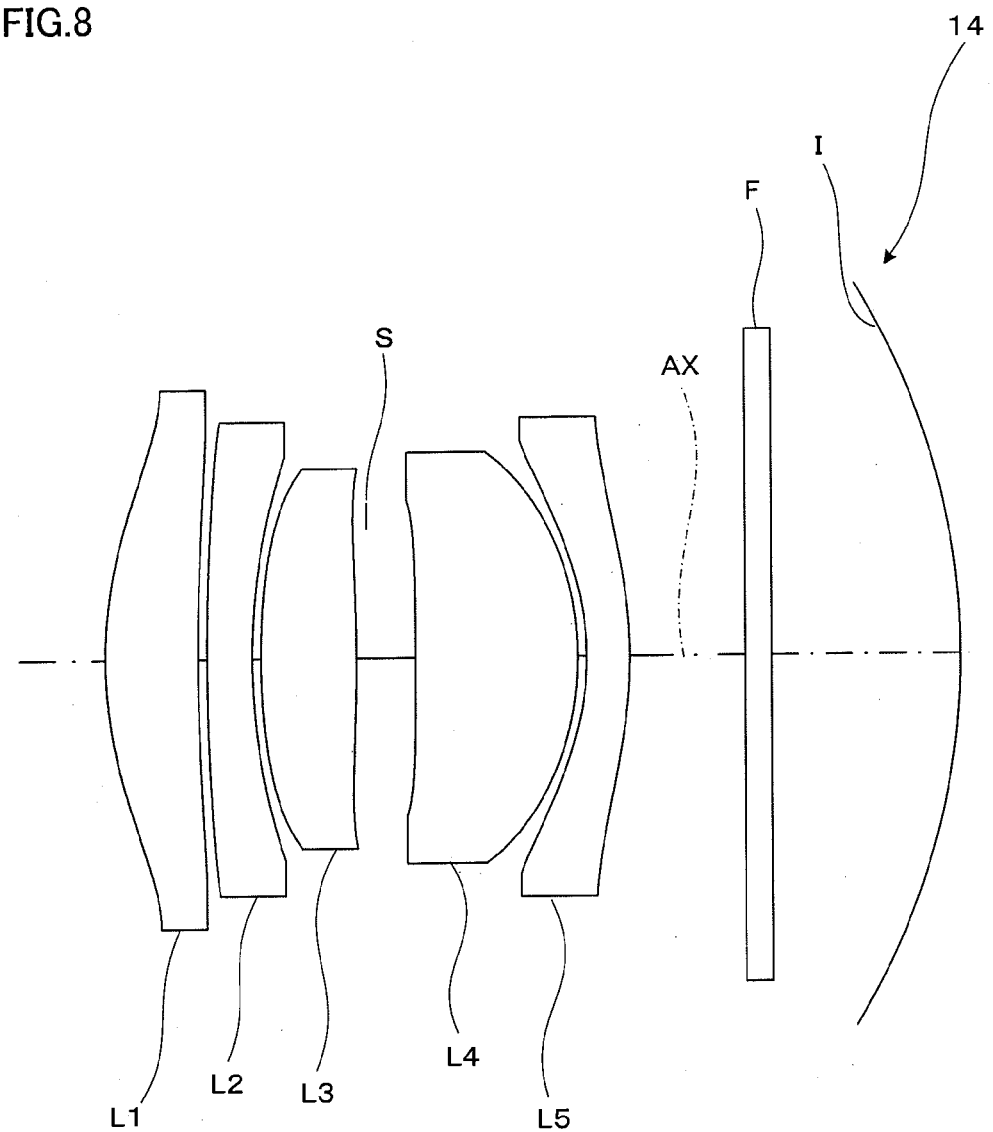
FIG. 8 is a cross sectional view of an image pickup lens of Example 4.

FIG. 8 is a cross sectional view of an image pickup lens 14 or the image pickup unit 50 of Example 4. The image pickup lens 14 includes the first lens L1 having a positive refractive power and being convex on the object side, the second lens L2 having a negative refractive power and being convex on the object side, the third lens L3 having a positive refractive power and being convex on both sides, the fourth meniscus lens L4 having a positive refractive power and being convex on the image side, and the fifth meniscus lens L5 having a negative refractive power and being convex on the image side. All the lenses L1 to L5 are formed from plastic materials. The aperture stop S is disposed between the third lens L3 and the fourth lens L4. In the present example, the image pickup surface I has a spherical shape. Note that, between the light exit surface of the fifth lens L5 and the concave image pickup surface I, the parallel plate F, which is an IR cut filter or the like, is disposed.

Figure 9A:
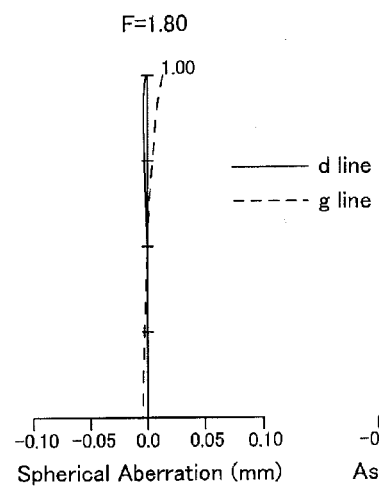
FIGS. 9A to 9E are aberration diagrams of the image pickup lens of Example 4.
Figure 9B:
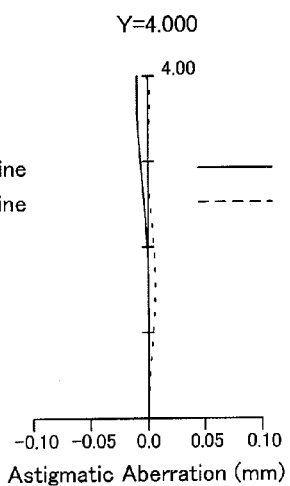
Figure 9C:
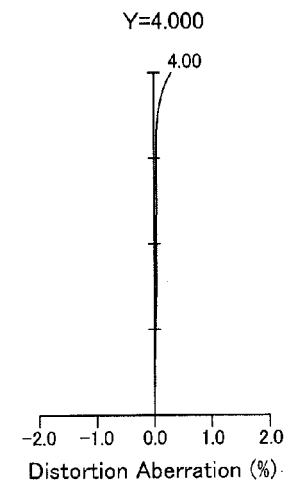
Figure 9D:
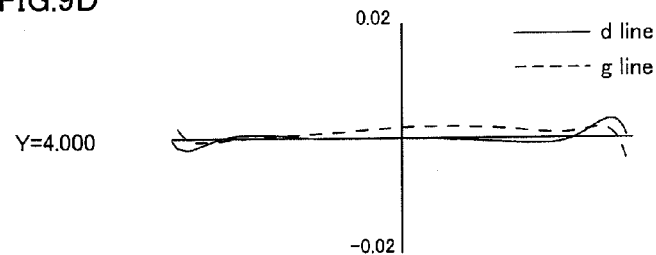
Figure 9E:
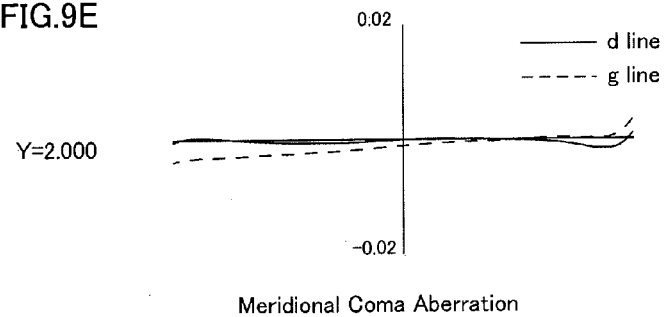

FIGS. 9A to 9C show the aberration diagrams (spherical aberration, astigmatic aberration and distortion aberration) of the image pickup lens 14 of Example 4, while FIGS. 9D and 9E show the meridional coma aberration of the image pickup lens 14 of Example 4.

Table 13 below summarizes the values of each of Examples 1 to 4 corresponding to each of the conditional expressions (1) to (9), for reference.

TABLE 13

| conditional expression | | Example 1 | Example 2 | Example 3 | Example 4 |
|---|---|---|---|---|---|
| (1) | f5/f | -1.05 | -1.09 | -0.50 | -2.33 |
| (2) | SAGI/Y | 0.42 | 0.40 | 0.23 | 0.98 |
| (3) | RI/Y | -4.25 | -3.65 | -6.30 | -2.08 |
| (4) | f1/f | 0.79 | 0.94 | 0.74 | 1.74 |
| (5) | (r3 + r4)/(r3 - r4) | 1.77 | 1.20 | 0.83 | 1.76 |
| (6) | fb/f | 0.15 | 0.33 | 0.23 | 0.56 |
| (7) | f/|f3| | 0.31 | 0.47 | 0.36 | 0.56 |
| (8) | PZT/f | 0.019 | 0.038 | 0.022 | 0.020 |
| (9) | L/2Y | 0.71 | 0.86 | 0.76 | 1.18 |

Note that, with regard to the meaning of the paraxial curvature radius described in the claims, the examples, and the like, in the actual lens measurement, an approximate curvature radius in fitting the shape-measured values in a vicinity of the lens center (specifically, in the center region within 10% relative to a lens outer diameter) by a least square method can be regarded as the paraxial curvature radius.

Moreover, for example, in the case where a second-order aspherical surface coefficient is used, a curvature radius taking into consideration the second-order aspherical surface coefficient as well as a standard curvature radius of the definitional equation of an aspherical surface can be regarded as the paraxial curvature radius (e.g., see for reference, pp. 41 to 42 of "Lens Design Method", Yoshiya Matsui, KYORITSU SHUPPAN Co., Ltd.).

The invention claimed is:

1. An image pickup lens for an image pickup device, which is provided in the image pickup device and used for forming an object image onto a projection surface, wherein the projection surface is curved so as to lean to an object side in any cross section heading for a periphery of a picture plane, the image pickup lens comprising, in order from the object side:
a first lens having a positive refractive power;
a second lens having a negative refractive power;
a third lens having a positive or negative refractive power;
a fourth lens having a positive or negative refractive power; and
a fifth lens having at least one aspherical surface and having a negative refractive power, and
satisfying the following conditional expression:

$$-2.50 < f5/f < -0.10 \quad (1)$$

where f5 is a focal length of the fifth lens, and
f is a focal length of an entire system of the image pickup lens, wherein the projection surface has a spherical shape and satisfies the following conditional expression:

$$-8.0 < RI/Y < -1.0 \quad (3)$$

where RI is a curvature radius of the projection surface and Y is the maximum image height.

2. The image pickup lens according to claim 1, wherein a curvature amount of the projection surface satisfies the following conditional expression:

$$0.05 < SAGI/Y < 1.50 \quad (2)$$

where SAGI is a displacement in an optical axis direction of the projection surface and
Y is a maximum image height.

3. The image pickup lens according to claim 1, wherein the first lens has a shape having a convex surface facing the object side, and satisfies the following conditional expression:

$$0.4 < f1/f < 2.0 \quad (4)$$

where f1 is a focal length of the first lens and
f is the focal length of the entire system of the image pickup lens.

4. The image pickup lens according to claim 1, wherein the second lens has a shape having a concave surface facing an image side and satisfies the following conditional expression:

$$0.50 < (r3+r4)/(r3-r4) < 2.00 \quad (5)$$

where r3 is a curvature radius of the object side surface of the second lens and
r4 is a curvature radius of the image side surface of the second lens.

5. The image pickup lens according to claim 1, satisfying following conditional expression:

$$0.10 < fb/f < 0.70 \quad (6)$$

where fb is a back focus of the image pickup lens and
f is the focal length of the entire system of the image pickup lens.

6. The image pickup lens according to claim 1, wherein an image side surface of the third lens has an aspherical shape and satisfies the following conditional expression:

$$0.20 < f/|f3| < 0.75 \quad (7)$$

where f is the focal length of the entire system of the image pickup lens and
f3 is a focal length of the third lens.

7. The image pickup lens according to claim 1, satisfying the following conditional expression:

$$0.015 < PTZ/f < 0.045 \quad (8)$$

where PTZ is a Petzval sum of the entire system of the image pickup lens and
f is the focal length of the entire system of the image pickup lens.

8. The image pickup lens according to claim 1, wherein an aperture stop is disposed nearer to an image side than a position on an optical axis of the object side surface of the first lens and also nearer to the object side than the most peripheral portion of the object side surface of the first lens.

9. The image pickup lens according to claim 1, wherein an aperture stop is disposed between the first lens and the second lens.

10. The image pickup lens according to claim 1, wherein an aperture stop is disposed between the third lens and the fourth lens.

11. The image pickup lens according to claim 1, further comprising a lens having substantially no power.

12. An image pickup device comprising the image pickup lens according to claim 1.

13. An image pickup lens for an image pickup device, which is provided in the image pickup device and used for forming an object image onto a projection surface, wherein the projection surface is curved so as to lean to an object side in any cross section heading for a periphery of a picture plane, the image pickup lens comprising: in order from the object side,
a first lens having a positive refractive power;
a second lens having a negative refractive power;
a third lens having a positive or negative refractive power;
a fourth lens having a positive or negative refractive power; and
a fifth lens having at least one aspherical surface and having a negative refractive power, and
satisfying the following conditional expression:

$$-2.50 < f5/f < -0.10 \quad (1)$$

where f5 is a focal length of the fifth lens, and
f is a focal length of an entire system of the image pickup lens, wherein a curvature amount of the projection surface satisfies the following conditional expression:

$$0.05 < SAGI/Y < 1.50 \quad (2)$$

where SAGI is a displacement in an optical axis direction of the projection surface and
Y is a maximum image height.

14. An image pickup lens for an image pickup device, which is provided in the image pickup device and used for forming an object image onto a projection surface, wherein the projection surface is curved so as to lean to an object side in any cross section heading for a periphery of a picture plane, the image pickup lens comprising, in order from the object side:
a first lens having a positive refractive power;
a second lens having a negative refractive power;
a third lens having a positive or negative refractive power;
a fourth lens having a positive or negative refractive power; and a fifth lens having at least one aspherical surface and having a negative refractive power, wherein the following conditional expression is satisfied:

$$-2.50 < f5/f < -0.10 \quad (1)$$

where f5 is a focal length of the fifth lens, and
f is a focal length of an entire system of the image pickup lens, and wherein the following conditional expression is satisfied:

$$0.015 < PTZ/f < 0.045 \quad (8)$$

where PTZ is a Petzval sum of the entire system of the image pickup lens and f is the focal length of the entire system of the image pickup lens.

* * * * *